(12) United States Patent
Bowles et al.

(10) Patent No.: US 7,619,468 B1
(45) Date of Patent: Nov. 17, 2009

(54) DOHERTY AMPLIFIER WITH DRAIN BIAS SUPPLY MODULATION

(75) Inventors: Gregory J. Bowles, Nepean (CA); Widdowson Scott, Ottawa (CA); Graham Dolman, Saffron Walden (GB)

(73) Assignee: Nortel Networks Limited, St. Laurent, Quebec (CA)

( * ) Notice: Subject to any disclaimer, the term of this patent is extended or adjusted under 35 U.S.C. 154(b) by 0 days.

(21) Appl. No.: 12/241,424

(22) Filed: Sep. 30, 2008

(51) Int. Cl.
*H03F 3/68* (2006.01)
(52) U.S. Cl. .................................. 330/124 R
(58) Field of Classification Search ............. 330/124 R, 330/295; 455/127.1
See application file for complete search history.

(56) References Cited

U.S. PATENT DOCUMENTS

| | | | |
|---|---|---|---|
| 5,568,086 A * | 10/1996 | Schuss et al. ........... | 330/124 R |
| 6,703,879 B2 | 3/2004 | Okuda | |
| 7,009,454 B2 * | 3/2006 | Rategh et al. ............... | 330/295 |
| 2006/0293011 A1 * | 12/2006 | Park et al. ................... | 455/260 |
| 2008/0088369 A1 | 4/2008 | Bowles | |

* cited by examiner

*Primary Examiner*—Steven J Mottola
(74) *Attorney, Agent, or Firm*—Barnes & Thornburg LLP

(57) ABSTRACT

An enhanced Doherty-configured amplifier that features separate and independent bias voltage sources for the main and auxiliary amplifiers. The bias voltage sources may be controllable and variable to alter the performance of the amplifier according to the input signal or system requirements. The enhanced amplifier includes a signal preparation unit to divide and shape the input signal in order to compensate for non-linearities in the combined output signal.

18 Claims, 5 Drawing Sheets

DOHERTY AMPLIFIER WITH DRAIN BIAS SUPPLY MODULATION

FIELD OF THE APPLICATION

The present application relates generally to signal amplification and specifically to a device and method for controlling efficiency and performance of an amplification device.

BACKGROUND

Wireless devices use Radio Frequencies (RF) to transmit information. For example, cell phones use amplified RF to transmit voice data to base stations, which allow signals to be relayed to communications networks. Other existing wireless communication devices include Bluetooth, HomeRF and WLAN. In a conventional wireless device, the power amplifier consumes most of the power of the overall wireless system. For systems that run on batteries, a power amplifier with a low efficiency results in a reduced communication time for a given battery life. For continuous power systems, a decrease in efficiency results in increased power usage and heat removal requirements, which may increase the equipment and operating costs of the overall system.

For this reason, much effort has been expended on increasing the efficiency of RF power amplifiers. One type of amplifier that may provide increased efficiency is a Doherty-type power amplifier. A common Doherty-type power amplifier design includes a main amplifier and an auxiliary amplifier. The main amplifier is operated to maintain optimal efficiency up to a certain power level and allows the auxiliary amplifier to operate above that level. When the power amplifier is operated at a high output power level, the main amplifier will be heavily compressed such that non-linearities are introduced into the amplified signal. In common Doherty-type amplifiers, the main and auxiliary amplifiers are composed of the same type of amplifiers with the same maximum power rating. These Doherty-type amplifiers develop an efficiency peak 6 dB back of full power which in theory will be equal in magnitude to the maximum efficiency of the system.

New amplifier architectures and device technologies allow for designs wherein the location of the efficiency peak in back-off may be moved about the traditional 6 dB point and wherein magnitudes exceed the maximum compressed system efficiency. Doherty-type devices capable of an increased efficiency over a wide range of output power levels may be provided by using a main amplifier design of different size or materials than that of the auxiliary amplifier. However, the choice of materials and designs for such amplifiers must be set when a product is manufactured and only coarse, incremental changes in the location of the efficiency peak may be achieved. Due to variations in system applications and in the signals which require amplification, it would be desirable to have a Doherty-type device capable of operation and peak efficiency for various signal output power levels and peak to average signal ratios. Further, it would be desirable to have an amplification device which is dynamically configurable to meet system requirements without requiring modification to the device hardware.

BRIEF SUMMARY

The present application discloses and describes a Doherty-type amplifier having a peak efficiency point that may be adapted to various signal characteristics. The main amplifier and auxiliary amplifier are biased by separate and independent bias voltage supplies. In some embodiments, the bias voltage supplies are fixed and have different voltage levels. In some embodiments, the bias voltage supplies are variable and may be adjusted to achieve different performance characteristics.

In one aspect, the present application describes a signal amplifier. The signal amplifier includes a signal preparation unit adapted to divide an input signal into a main input signal and an auxiliary input signal, wherein the signal preparation unit includes a dual drive module configured to apply signal shaping to the main input signal and the auxiliary input signal. The signal amplifier also includes a main amplifier configured to receive the main input signal and output an amplified main signal, a main bias voltage source supplying a main bias voltage to the main amplifier, an auxiliary amplifier configured to receive the auxiliary input signal and output an amplified auxiliary signal, an auxiliary bias voltage source supplying an auxiliary bias voltage to the auxiliary amplifier, and a signal combiner adapted to combine the amplified main signal and the amplified auxiliary signal into an output signal. The main bias voltage source is independent from the auxiliary bias voltage source.

In another aspect, the present application describes a base station for receiving and sending wireless RF communications. The base station includes an RF antenna, an RF transmitter connected to the RF antenna and configured to up-convert and amplify a transmit signal for propagation by the RF antenna, an RF receiver connected to the RF antenna and configured to down-convert a received RF signal from the RF antenna, and a signal controller with a network port for sending and receiving communications with a network, the signal controller being connected to and controlling the RF receiver and the RF transmitter. The RF transceiver includes the signal amplifier.

In yet another aspect, the present application describes a method of amplifying an input signal. The method includes dividing an input signal into a main input signal and an auxiliary input signal and applying signal shaping to the main input signal and the auxiliary input signal, biasing a main amplifier with a main bias voltage from a main bias voltage source, biasing an auxiliary amplifier with an auxiliary bias voltage from an auxiliary bias voltage source, amplifying the main input signal using the main amplifier to generate an amplified main signal, amplifying the auxiliary input signal using the auxiliary amplifier to generate an amplified auxiliary signal, and combining the amplified main signal and the amplified auxiliary signal to create an output signal. The main bias voltage source is independent from the auxiliary bias voltage source.

Further aspects and features of example embodiments are described below in conjunction with the accompanying figures.

BRIEF DESCRIPTION OF THE DRAWINGS

Reference will now be made, by way of example, to the accompanying drawings which show example embodiments, and in which.

DETAILED DESCRIPTION

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents It is further understood that as used herein, terms such as coupled, connected, electrically connected, in signal communication, and the like may include direct connections between components, indirect connections between components, or both, as would be apparent in the overall context of a particular embodiment. The term coupled is intended to include, but not be limited to, a direct electrical connection. The terms transmit, transmitted, or transmitting is intended to include, but not be limited to, the electrical transmission of a signal from one device to another.

Figure 1:
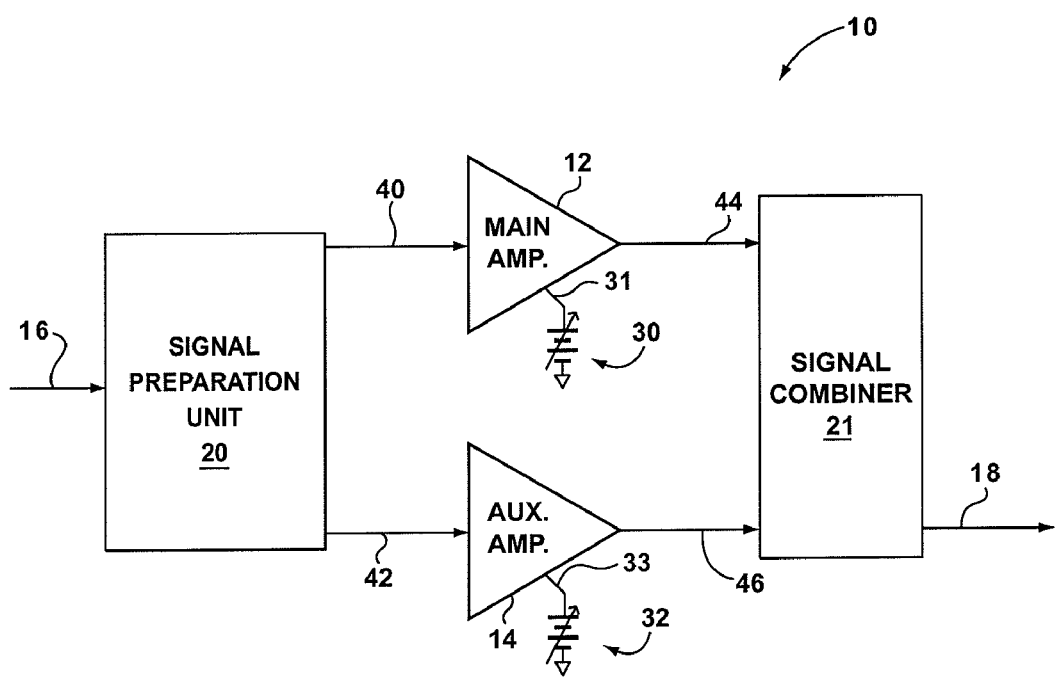
FIG. 1 diagrammatically shows an example embodiment of an enhanced amplifier.

Reference is first made to FIG. 1, which shows a block diagram of an example embodiment of an enhanced amplifier 10. The enhanced amplifier 10 is arranged in a Doherty configuration, having a main amplifier 12 in parallel with an auxiliary amplifier 14. An input signal 16 is received by a signal preparation unit 20, which divides the input signal into a main input signal 40 and an auxiliary input signal 42 that are input to the main amplifier 12 and auxiliary amplifier 14, respectively. The main amplifier 12 outputs a main amplified signal 44 and the auxiliary amplifier 14 outputs an auxiliary amplified signal 46 to a signal combiner 21.

The signal combiner 21 includes a main amplifier impedance transformer 22 in the output path of the main amplifier 12. In most embodiments, the main amplifier impedance transformer 22 is selected to produce a 90 degree phase shift in the main amplified signal 44. The main amplifier impedance transformer 22 may also be selected for impedance matching purposes from the point of view of the output port of the enhanced amplifier 10. As known to those ordinarily skilled in the art, the output path typically is designed to provide both a phase offset of 90 degrees as well as an appropriate impedance transformation when the auxiliary amplifier 14 is off. The main amplified signal 44 and auxiliary amplified signal 46 are combined in the signal combiner 21 using techniques which will be appreciated by those skilled in the art to produce the output signal 18.

The enhanced amplifier 10 features differential bias control for the main amplifier 12 and auxiliary amplifier 14. This feature offers greater flexibility in establishing the peak efficiency point to adapt to particular signal and network conditions. In the example shown in FIG. 1, the main amplifier 12 is connected to a main bias voltage source 30 to receive a main bias voltage 31, and the auxiliary amplifier 12 is connected to an auxiliary bias voltage source 32 to receive an auxiliary bias voltage 33. The main bias voltage 31 is separate and independent from the auxiliary bias voltage 33. In most implementations the main bias voltage 31 is set to a different voltage level than the auxiliary bias voltage 33.

In many embodiments, the main bias voltage 31 and auxiliary bias voltage 33 may be preselected or predetermined based on the expected characteristics of the input signal 16 and/or output signal 18. For example, the determination of the bias voltages 31, 33 may be based upon the expected average output power of the output signal 18 and/or the peak-to-average ratio (PAR) of the output signal 18. Other characteristics may be used in addition to or instead of average power and PAR to determine the appropriate bias voltages 31, 33, for a given application. If the bias voltages 31, 33 are predetermined for a particular implementation, then the main bias voltage source 30 and auxiliary bias voltage source 32 may be static DC voltage sources. In some embodiments, the sources 30, 32 may include voltage rails configured to supply the preselected voltage level and derived from an external voltage source. In another embodiment, the sources 30, 32 may include one or more voltage sources specifically dedicated to the enhanced amplifier 10. Those ordinarily skilled in the art will appreciate the range of possible electrical mechanisms for implementing the two independent bias voltage sources 30, 32.

In one example embodiment, the main amplifier 12 and auxiliary amplifier 14 may be semiconductor devices of different material compositions, different designs, or both different material compositions and different designs. The use of a first semiconductor device for the main amplifier 12 and a second semiconductor device for the auxiliary amplifier 14, wherein the first semiconductor device is not the same as the second semiconductor device, can be used to enhance the efficiency of enhanced amplifier 10. Use of a main amplifier 12 having a different amplifier design from auxiliary amplifier 14 may enhance the operational efficiency of the enhanced amplifier 10.

The use of two different bias voltages on the main and auxiliary amplifiers 12, 14 may exacerbate non-linearities that can be created in the amplification process. A Doherty-configured amplifier typically exhibits non-linearities since the main amplifier is biased in Class AB and the auxiliary amplifier is biased in Class C, both of which exhibit input-to-output non-linearity. If the main amplifier 12 and auxiliary amplifier 14 are different devices (different materials or different designs) then the non-linearity may be further exacerbated. Accordingly, the signal preparation unit 20 may be adapted to compensate for non-linearities in the amplification stage by performing signal preparation prior to amplification. For example, in some embodiments, the signal preparation unit 20 may be configured to perform signal shaping to partly compensate for non-linearities in the amplification stage. Signal shaping allows appropriate portions of the signal to be separated and routed to the main and auxiliary amplifiers 12, 14. In another example, the signal preparation unit 20 may be configured to perform pre-distortion linearization, adding to or subtracting from the input signal 16 to try to offset the resulting non-linear effects of the amplifier stage. Other pre-amplification non-linear compensation techniques or operations may also be employed. Various operations and configurations for offsetting or compensating for non-linearities in a Doherty amplifier are described in U.S. patent application Ser. No. 11/537,084, entitled Enhanced Doherty Amplifier with Asymmetrical Semiconductors, filed Sep. 29, 2006, and owned in common herewith, and the contents of which are hereby incorporated by reference.

Figure 2:
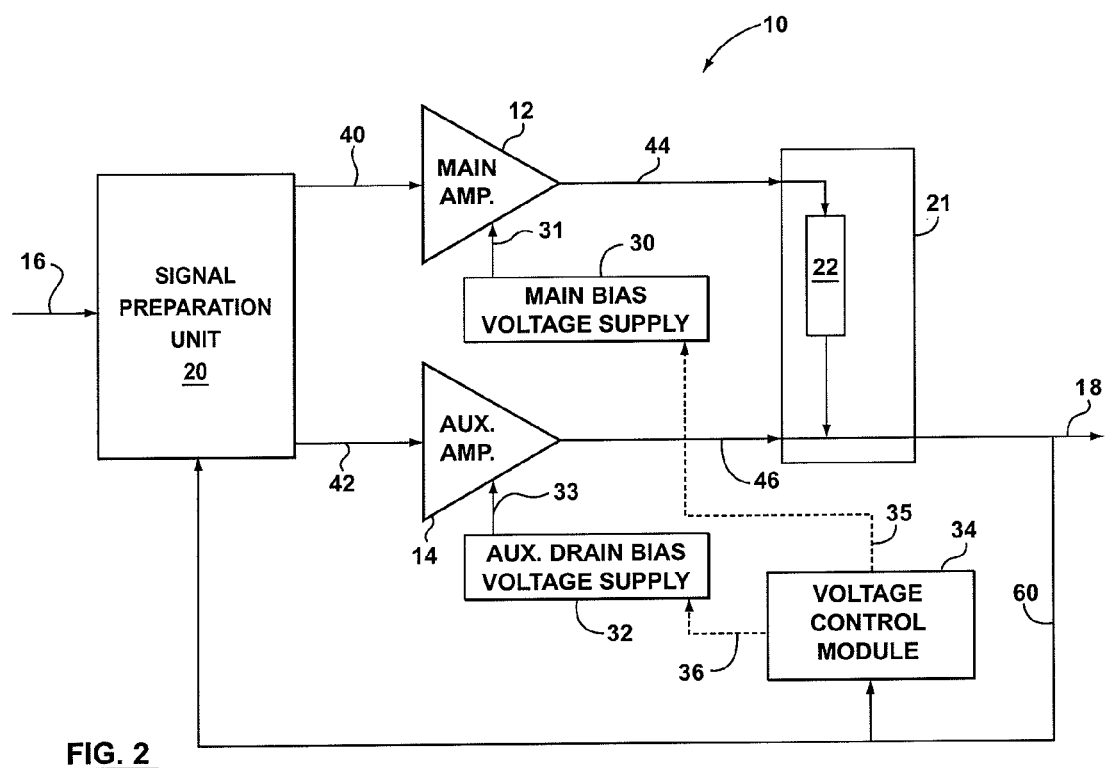
FIG. 2 shows a block diagram of another example embodiment of an enhanced amplifier.

Reference is now made to FIG. 2, which shows another embodiment of the enhanced amplifier 10. The main bias voltage source 30 and the auxiliary bias voltage source 32 provide independent bias voltage supplies for the main amplifier 12 and auxiliary amplifier 14, respectively. In this embodiment, the bias voltage sources 30, 32 are variable voltage supplies. The enhanced amplifier 10 includes a voltage control module 34 coupled to the bias voltage sources 30, 32 to independently control the setting of the main bias voltage 31 and the auxiliary bias voltage 33. The voltage control module 34 may output a main control signal 35 to the main bias voltage source 30 to set the main bias voltage 31, and it may output an auxiliary control signal 36 to the auxiliary bias voltage source 32 to set the auxiliary bias voltage 33. The bias voltage sources 30, 32 may be varied during system operation to adapt to changing signal characteristics or system conditions or they may be initialized following a reset or powering-on condition.

The enhanced amplifier 10 may include a feedback loop. A feedback signal 60 from the output signal 18 may be returned to the signal preparation unit 20. The feedback signal 60 provides information regarding the output signal 18 and may allow the signal preparation unit 20 to monitor various signal characteristics based upon which it may control various parameters or operations in the signal preparation unit 20. For example, using the feedback signal 60, the signal preparation unit 20 may monitor the power level of the output signal 18, and may collect statistics regarding average output power, peak-to-average ratio, etc. Based on these statistics, it may adjust its signal shaping or pre-distortion linearization operations, if any.

As shown in FIG. 2, the voltage control module 34 may also receive the feedback signal 60. This enables the voltage control module 34 to adjust the bias voltages 31, 33 to react to changes in the signal characteristics of the output signal 18. In some embodiments, the feedback signal 60 may not be directly received by the voltage control module 34, which may instead receive or obtain signal statistics information or data from the signal preparation unit 20. It will also be appreciated that the voltage control module 34 is not necessarily implemented as a stand-alone module separate from the signal preparation unit 20, and may be incorporated within the signal preparation unit 20 in some embodiments. Other variations will be appreciated by those skilled in the art.

Main and auxiliary bias voltage sources 30, 32 may comprise high efficiency variable voltage source designs as can be readily achieved by those skilled in the art. For example, a 60 W amplifier that is 40% efficient would require an average DC supply of 150 W or approximately 5.4 A, to provide a 28V bias voltage. In many embodiments, the efficiency of the variable voltage sources should be high such that they do not degrade the efficiency of the main and auxiliary amplifiers 12, 14. Those ordinarily skilled in the art will appreciate the appropriate characteristics of a variable voltage source for a particular application.

With the ability to independently control or vary the main bias voltage 30 and the auxiliary bias voltage 32, the operation of the enhanced amplifier 10 may be scaled to provide an optimal efficiency and gain at a predetermined output power (Pout) level. For example, in some systems or implementations which do not experience a high average power, the bias voltages 31, 33 may be varied to provide an efficiency peak at a lower power level.

Figure 3:
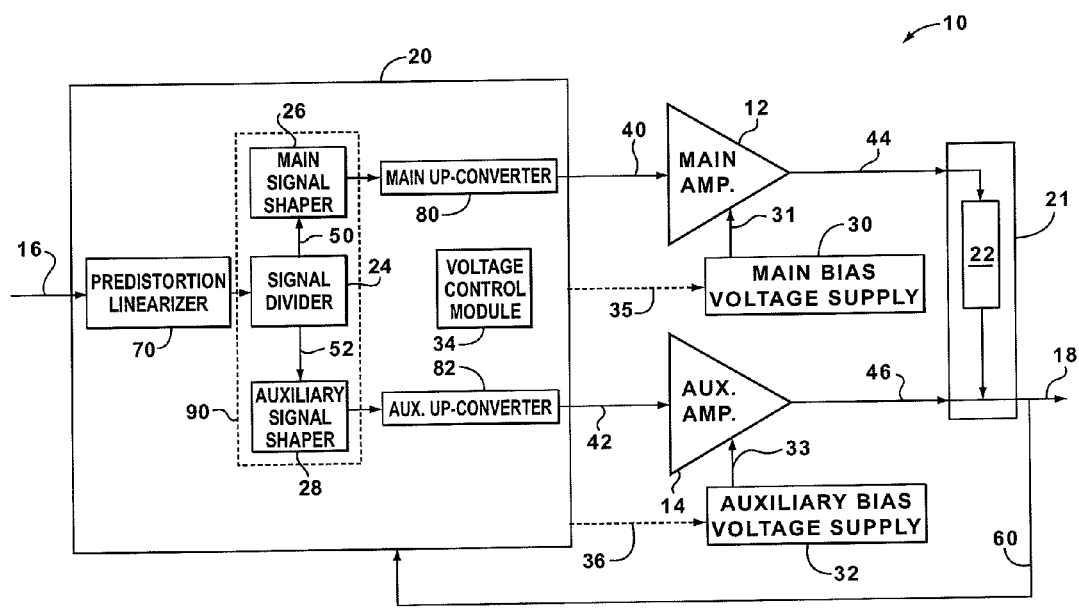
FIG. 3 shows a block diagram of a further embodiment of the enhanced amplifier.

Reference is now made to FIG. 3, which shows a further embodiment of the enhanced amplifier 10. In this embodiment, the voltage control module 34 is shown as being implemented with the signal preparation unit 20. The signal preparation unit 20 receives the feedback signal 60 and collects statistics, such as, for example, average output power and PAR, based upon which it controls predistortion and signal shaping operations within the signal preparation unit 20. Some of the same statistics may be used by the voltage control module 34 to control the bias voltage sources 30, 32. In one embodiment, the magnitude of the main bias voltage 31 may be made proportional to the average output power, $P_{out(avg)}$, and the auxiliary bias voltage 33 may be made proportional to the peak output power, $P_{out(peak)}$.

As shown in FIG. 3, the signal preparation unit 20 is configured to divide the input signal 16 into the main input signal 40 and the auxiliary input signal 42. In the course of dividing the input signal 16, the signal preparation unit 20 may perform certain operations to compensate for non-linearities introduced by the asymmetric Doherty configuration of the main and auxiliary amplifiers 12, 14.

The signal preparation unit 20 includes a signal divider 24 for dividing the input signal 16 into a main portion 50 and an auxiliary portion 52. The signal divider 24 does not necessarily split the input signal 16 into equal portions. In fact, the signal divider 24 may unevenly divide the input signal 16 and alter the division depending on the state of the main and auxiliary amplifiers 12, 14. In particular, all or most of the input signal 16 may be initially directed to the main amplifier 12 until it is driven into compression; after which the signal divider 24 may alter the division to increase the magnitude of the auxiliary portion 52.

The signal preparation unit 20 also includes a main signal shaper 26 and an auxiliary signal shaper 28. The signal shapers 26, 28, apply signal shaping techniques to improve the efficiency of the enhanced amplifier 10 and, in some cases, the signal preparation unit 20 may apply filtering or other predistortion functions to the main portion 50 and auxiliary portion 52 to compensate for non-linearities. In one embodiment, the signal shapers 26, 28 are configured such that the main signal shaper 26 shapes the main portion 50 into a base portion of the input signal 16 for amplification by the main amplifier 12 and the auxiliary signal shaper 28 shapes the auxiliary portion 52 into a peak portion of the input signal 16 for amplification by the auxiliary amplifier 14. Other shaping and compensation operations will be appreciated by those of ordinary skill in the art.

The signal divider 24 and the signal shapers 26, 28 may collectively be referred to as a dual drive module 90. The dual drive module 90 may be implemented using analog components in some embodiments. In many embodiments, the dual drive module 90 may be implemented digitally. For example, the dual drive module 90 may be implemented using a digital signal processor (DSP), a suitable programmed microcontroller, or an application specific integrated circuit (ASIC). The suitable programming of such a device to achieve the functionality described herein will be within the skill of a person of ordinary skill in the art.

In many embodiments, the dual drive module 90 is configured to operate on a baseband analog signal or a digital signal. Accordingly, the signal preparation unit 20 may include a main up-converter 80 and an auxiliary up-converter 82 for generating the RF main input signal 40 and the RF auxiliary input signal 42. Alternatively, the signal preparation unit 20 may be implemented using a direct RF solution with the signals being converted directly from digital to radio frequency to provide the RF main input signal 40 and the RF auxiliary input signal 42.

The signal preparation unit 20 may further include a pre-distortion linearizer 70. The pre-distortion linearizer 70 applies pre-distortion to the input signal 16 to compensate for or offset non-linearities causes by the non-linear operation of the enhanced amplifier 10. The feedback signal 60 may provide information for dynamically adjusting or configuring the pre-distortion linearizer 70.

In a given implementation of the enhanced amplifier 10, the location of the peak efficiency may be determined through use of a power sweep. In one example embodiment, the main and auxiliary amplifiers 12, 14 may be asymmetrical in terms of maximum power rating with the main amplifier 12 having approximately 100 W capability and the auxiliary amplifier 14 having approximately 200 W capability. The main amplifier 12 may include LDMOS FETs and may be biased in Class AB based on a standard 28V supply and the main drain bias voltage varied from 5 to 35V. The auxiliary amplifier 14 may include LDMOS FETs and may be biased in "deep" class C (Vgs=0.50 V) with the auxiliary drain bias voltage held at a constant 28V. As the main drain bias voltage is increased, the location of peak efficiency in back-off increases from approximately 34 dBm to just above 50 dBm. The magnitude of the efficiency peak in back-off increases with the increase in main drain bias voltage and the gain magnitude also increases. Maximum achievable power increases marginally as the main drain bias voltage is increased.

In another example embodiment, with the main amplifier 12 having approximately 100 W capability and the auxiliary amplifier 14 having approximately 200 W capability, the auxiliary drain bias voltage may be varied. In this embodiment, the main amplifier 12 may include LDMOS FETs and may be biased in Class AB and the main drain bias voltage held at a constant 28V. The auxiliary amplifier 14 may include LDMOS FETs and may be biased in "deep" class C (Vgs=0.50 V) based on a standard 28V supply and the auxiliary drain bias voltage varied from 5 to 35V. In this case, once a certain threshold is achieved, at about 15V, gain and efficiency in back-off remain constant. The maximum achievable power increases significantly as the auxiliary amplifier drain bias voltage is increased. The location and depth of the transition trough also increase as the auxiliary amplifier drain bias voltage increases.

Figure 4:
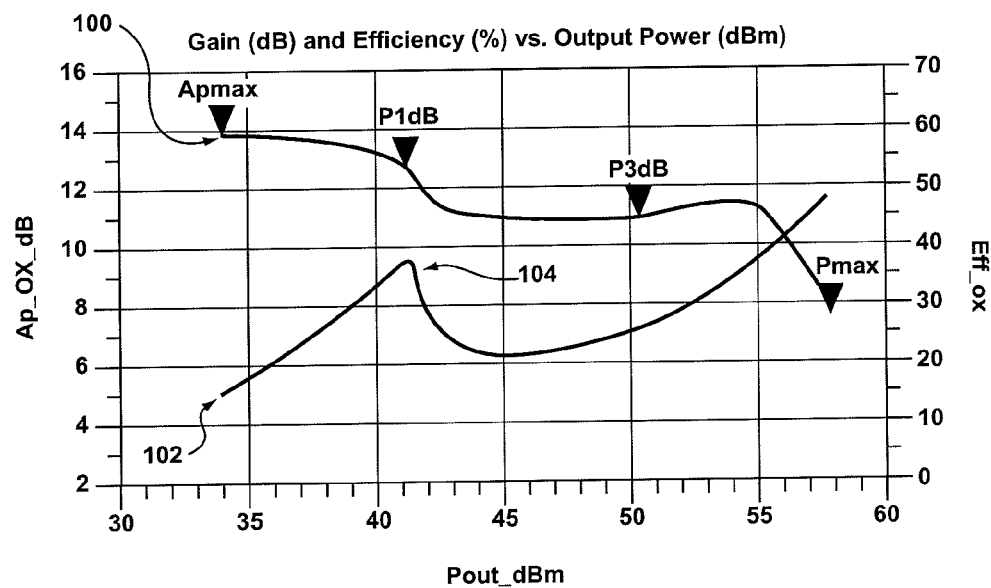
FIG. 4 shows a graph of gain and efficiency versus output power for an example embodiment of the enhanced amplifier.

In another embodiment, the main and auxiliary amplifiers may be asymmetrical in terms of maximum power rating with the main amplifier 12 having approximately 100 W capability and the auxiliary amplifier 14 having approximately 200 W capability. The main amplifier may include LDMOS FETs and may be biased in Class AB and the main drain bias voltage held at a reduced level of 15V. The auxiliary amplifier 14 may include LDMOS FETs and may be biased in "light" class C (Vgs=3.30V) with the auxiliary drain bias voltage held constant at an increased level of 35V. In this case, with input signal shaping, gain in back-off is held above standard Doherty levels. Reference is now made to FIG. 4, which shows a graph 100 of gain versus output power and a graph 102 of efficiency versus output power. As shown in the graph 102, the location of the first efficiency peak 104 in back-off is reduced to approximately 41 dbm and the magnitude of the first efficiency peak 104 in back-off is decreased to between 35-40%. The magnitude of gain during Doherty transition is held somewhat constant for an approximately 15 dB range and the maximum compressed power level Pmax is increased by approximately 2 dB to more than 57 dBm. In this embodiment, using components which provide typically a 7.78 dB separation, a 16 dB efficiency peak separation is provided without physical design variations.

In the embodiments described above and illustrated in the Figures, as the performance of the main and auxiliary amplifiers 12, 14 is varied, delay and phase variations also are introduced in the amplified signals. The output signal 18 which is created from the main amplified signal 44, main amplifier impedance transformer 22 and the auxiliary amplified signal 46 should be in phase. This may be accomplished in any way known to one skilled in the art, including, but not limited to, realigning the phasing using baseband/digital delay techniques. Baseband/digital delay techniques are intended to refer to any delay techniques that include, but are not limited to, those that digitally delay the transmission of signals. Use of baseband/digital techniques in the signal preparation unit 20 provide for dynamic control of the input signals to account for the non-linearities and variations introduced by varying the main and auxiliary bias voltage sources 12, 14. Feedback signal line 60 allows signal preparation unit 20 to monitor the signal leaving enhanced amplification unit 10, and to make adjustments to pre-distortion linearizer 70 or dual drive module 90. In some embodiments, an auxiliary path phase offset may be introduced using a suitable component (not shown). The auxiliary path phase offset may be fixed or variable.

Figure 5:
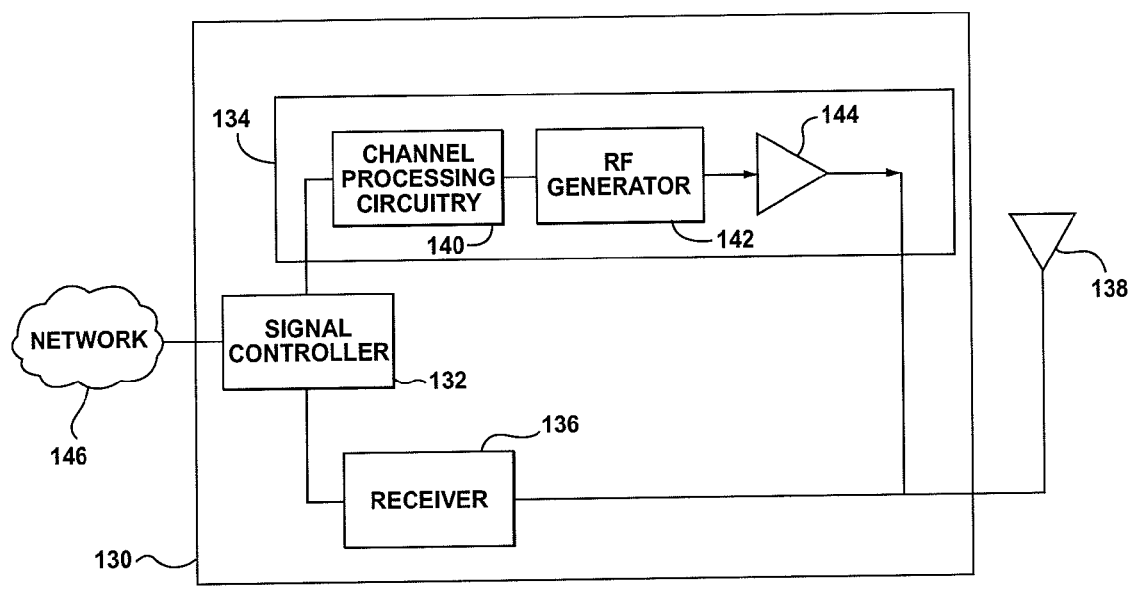
FIG. 5 shows a block diagram of an example base station for a wireless network.

Reference is now made to FIG. 5, which shows a block diagram of a wireless network base station 130 incorporating the enhanced amplifier 144. Base station 130 is a medium to high-power multi-channel, two-way radio in a fixed location. It may typically be used by low-power, single-channel, two-way radios or wireless devices such as mobile phones, portable phones and wireless routers. Base station 130 may comprise a signal controller 132 that is coupled to a transmitter 134 and a receiver 136. Transmitter 134 and receiver 136 (or combined transceiver) is further coupled to an antenna 138. In base station 130, digital signals are processed in signal controller 132. The digital signals may be signals for a wireless communication system, such as signals that convey voice or data intended for a mobile terminal (not shown). Base station 130 may employ any suitable wireless technologies or standards such as 2G, 2.5G, 3G, GSM, IMT-2000, UMTS, iDEN, GPRS, EV-DO, EDGE, DECT, PDC, TDMA, FDMA, CDMA, W-CDMA, TD-CDMA, TD-SCDMA, GMSK, OFDM, etc. Signal controller 132 then transmits the digital signals to transmitter 134, which includes a channel processing circuitry 140. Channel processing circuitry 140 encodes each digital signal, and a radio frequency (RF) generator 142 modulates the encoded signals onto an RF signal. The RF signal is then amplified in an enhanced amplification unit 10. The resulting output signal is transmitted over antenna 138 to the mobile terminal. Antenna 138 also receives signals sent to base station 130 from the mobile terminal. Antenna 138 transmits the signals to receiver 136 that demodulates them into digital signals and transmits them to signal controller 132 where they may be relayed to an external network 146. Base station 130 may also comprise auxiliary equipment such as cooling fans or air exchangers for the removal of heat from base station 130.

In one embodiment, the enhanced amplifier 10 (FIG. 3) may be incorporated into base station 130 in lieu of parts, if not all, of blocks 142 and 144, which may decrease the capital costs and power usage of base station 130. The power amplifier efficiency measures the usable output signal power relative to the total power input. The power not used to create an output signal is typically dissipated as heat. In large systems such as base station 130, the heat generated by amplification may require cooling fans and other associated cooling equipment that may increase the cost of base station 130, require additional power, increase the overall size of the base station housing, and require frequent maintenance. Increasing the efficiency and improving control over the enhanced amplifier 10 in base station 130 may eliminate the need for some or all of the cooling equipment. Further, the supply power to enhanced amplifier 10 may be reduced since it may more efficiently be converted to a usable signal. The space and resources required to implement separate bias voltage sources 12, 14 in the enhanced amplifier 10 are offset by the control over device performance and efficiency characteristics. The physical size of base station 130 and the maintenance requirements may also be reduced due to the reduction of cooling equipment. This may enable base station 130 equipment to be moved to the top of a base station tower, allowing for shorter transmitter cable runs and reduced costs. In an embodiment, base station 130 has an operating frequency ranging from 800 MHz to 3.5 GHz.

While the enhanced amplifier has been described in conjunction with illustrated embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the invention.

What is claimed is:

1. A signal amplifier, comprising:
a signal preparation unit adapted to divide an input signal into a main input signal and an auxiliary input signal, wherein the signal preparation unit includes a dual drive module configured to apply signal shaping to the main input signal and the auxiliary input signal;
a main amplifier configured to receive the main input signal and output an amplified main signal;
a main bias voltage source supplying a main bias voltage to the main amplifier;
an auxiliary amplifier configured to receive the auxiliary input signal and output an amplified auxiliary signal;
an auxiliary bias voltage source supplying an auxiliary bias voltage to the auxiliary amplifier;
a signal combiner adapted to combine the amplified main signal and the amplified auxiliary signal into an output signal; and
a voltage control module adapted to independently control the main bias voltage source and the auxiliary bias voltage source,
wherein the main bias voltage source is independent from the auxiliary bias voltage source.

2. The signal amplifier claimed in claim 1, wherein the voltage control module is configured to output a main control signal to the main bias voltage source to set the main bias voltage, and to output an auxiliary control signal to the auxiliary bias voltage source to set the auxiliary bias voltage.

3. The signal amplifier claimed in claim 1, wherein the main bias voltage is substantially different from the auxiliary bias voltage.

4. The signal amplifier claimed in claim 1, further including a feedback path to the signal preparation unit for supplying the signal preparation unit with the output signal, and wherein the signal preparation unit is configured to calculate one or more output signal characteristics.

5. The signal amplifier claimed in claim 4, wherein the voltage control module is configured to adjust the main bias voltage in response to the output signal characteristics.

6. The signal amplifier claimed in claim 4, wherein the voltage control module is configured to adjust the auxiliary bias voltage in response to the output signal characteristics.

7. The signal amplifier claimed in claim 1, wherein the signal combiner includes a main path phase offset impedance for adjusting the phase of the amplified main signal.

8. The signal amplifier claimed in claim 1, wherein the signal combiner includes a pre-distortion linearizer.

9. The signal amplifier claimed in claim 1, wherein the main amplifier and auxiliary amplifier comprise RF power amplifiers, wherein the output signal comprises an RF signal, and wherein the signal preparation unit includes a main up-converter adapted to up-convert the main input signal to a main RF input signal and an auxiliary up-converter adapted to up-convert the auxiliary input signal to an auxiliary RF input signal.

10. A base station for receiving and sending wireless RF communications, the base station comprising:
an RF antenna;
an RF transmitter connected to the RF antenna and configured to up-convert and amplify a transmit signal for propagation by the RF antenna;
an RF receiver connected to the RF antenna and configured to down-convert a received RF signal from the RF antenna; and
a signal controller with a network port for sending and receiving communications with a network, the signal controller being connected to and controlling the RF receiver and the RF transmitter,
and wherein the RF transceiver includes an enhanced signal amplifier, the enhanced signal amplifier including:
a signal preparation unit adapted to divide a the transmit signal into a main input signal and an auxiliary input signal, wherein the signal preparation unit includes a dual drive module configured to apply signal shaping to the main input signal and the auxiliary input signal,
a main amplifier configured to receive the main input signal and output an amplified main signal,
a main bias voltage source supplying a main bias voltage to the main amplifier,
an auxiliary amplifier configured to receive the auxiliary input signal and output an amplified auxiliary signal,
an auxiliary bias voltage source supplying an auxiliary bias voltage to the auxiliary amplifier, and
a signal combiner adapted to combine the amplified main signal and the amplified auxiliary signal into an output signal,
and wherein the main bias voltage source is independent from the auxiliary bias voltage source.

11. The base station claimed in claim 10, further comprising a voltage control module adapted to independently control the main bias voltage source and the auxiliary bias voltage source.

12. The base station claimed in claim 11, wherein the voltage control module is configured to output a main control signal to the main bias voltage source to set the main bias voltage, and to output an auxiliary control signal to the auxiliary bias voltage source to set the auxiliary bias voltage.

13. The base station claimed in claim 10, wherein the main bias voltage is substantially different from the auxiliary bias voltage.

14. A method of amplifying an input signal, comprising:
dividing an input signal into a main input signal and an auxiliary input signal and applying signal shaping to the main input signal and the auxiliary input signal;
biasing a main amplifier with a main bias voltage from a main bias voltage source;
biasing an auxiliary amplifier with an auxiliary bias voltage from an auxiliary bias voltage source;
amplifying the main input signal using the main amplifier to generate an amplified main signal;
amplifying the auxiliary input signal using the auxiliary amplifier to generate an amplified auxiliary signal;
combining the amplified main signal and the amplified auxiliary signal to create an output signal; and
independently controlling the main bias voltage source and the auxiliary bias voltage source using a voltage control module,
wherein the main bias voltage source is independent from the auxiliary bias voltage source.

15. The method claimed in claim 14, further comprising supplying a main control signal from the voltage control module to the main bias voltage source to set the main bias voltage, and supplying an auxiliary control signal from the voltage control module to the auxiliary bias voltage source to set the auxiliary bias voltage.

16. The method claimed in claim 14, wherein the main bias voltage is substantially different from the auxiliary bias voltage.

17. The method claimed in claim 14, further comprising calculating one or more output signal characteristics from the output signal and controlling the main bias voltage in response to the output signal characteristics.

18. The method claimed in claim 14, further comprising calculating one or more output signal characteristics from the output signal and controlling the auxiliary bias voltage in response to the output signal characteristics.

\* \* \* \* \*